United States Patent [19]

Volkmann

[11] 4,259,631
[45] Mar. 31, 1981

[54] METHOD AND ARRANGEMENT FOR MEASURING THE ATTENUATION-VERSUS-FREQUENCY CHARACTERISTICS OF TWO-PORTS

[75] Inventor: Klaus Volkmann, Bergisch Gladbach, Fed. Rep. of Germany

[73] Assignee: Felten & Guilleaume Carlswerk AG, Cologne, Fed. Rep. of Germany

[21] Appl. No.: 6,500

[22] Filed: Jan. 25, 1979

[30] Foreign Application Priority Data

Mar. 3, 1978 [DE] Fed. Rep. of Germany ....... 2809154

[51] Int. Cl.³ .......................................... G01R 27/00
[52] U.S. Cl. ............................. 324/57 SS; 324/58 R; 324/58 A; 324/58 B; 324/103 P
[58] Field of Search ............... 324/57 SS, 58 R, 58 A, 324/58 B, 103 P

[56] References Cited

U.S. PATENT DOCUMENTS

| | | |
|---|---|---|
| 3,268,807 | 8/1966 | Shively .............................. 324/58 B |
| 3,711,771 | 1/1973 | Hume et al. ...................... 324/57 SS |
| 3,903,470 | 9/1975 | Mirabile et al. ............... 324/103 P X |
| 4,166,245 | 8/1979 | Roberts ............................ 324/103 P |
| 4,207,431 | 6/1980 | McVoy .......................... 324/58 R X |

*Primary Examiner*—Stanley T. Krawczewicz
*Attorney, Agent, or Firm*—Michael J. Striker

[57] ABSTRACT

A method and device for quickly performing simple frequency-response measurements on two-ports. A controllable-frequency constant-output-voltage A.C. voltage generator has its output connected to the input of the two-port of interest. A sawtooth generator applies a control sawtooth to the frequency-control input of the A.C. voltage generator, to effect a continuous frequency variation. A peak-value-storing digital meter connected to the output of the two-port during the frequency runthrough registers the peak output signal developed by the two-port, and also generates a control signal dependent upon detection of a peak value. The sawtooth signal is furthermore applied to a circuit which correlates the value of the sawtooth with successive ones of at least four successive frequency ranges. Simple indicators, such as a set of small lamps, are used to indicate which frequency range contains the registered peak value, for example with only the first indicator lamp lighting up when the first frequency range is the one, with the first two lamps or just the second lamp lighting up when the second frequency range contains the registered peak value; and so forth.

5 Claims, 2 Drawing Figures

METHOD AND ARRANGEMENT FOR MEASURING THE ATTENUATION-VERSUS-FREQUENCY CHARACTERISTICS OF TWO-PORTS

BACKGROUND OF THE INVENTION

The present invention relates to methods and apparatuses for measuring the attenuation-versus-frequency characteristics of two-ports (i.e., two-terminal-pair devices), the methods in question being of the type wherein there is applied to the input of the two-port an A.C. voltage which is constant in amplitude but whose frequency is continuously varied using an A.C. voltage generator whose frequency can be electronically controlled using a sawtooth voltage waveform. In methods of this type, the amplitude of the A.C. voltage appearing across the output terminal-pair of the two-port is measured by a digital measuring device, and in one way or another the frequency-dependence of such measured voltage amplitude is ascertained.

The use of a sweep generator or wobbulator to ascertain the frequency response of active and passive two-ports, with the frequency response ascertained being generated upon a display screen, such as of an oscilloscope, results in a complete measuring apparatus which is relatively expensive. Of the information which might be derived from a frequency-response curve thusly displayed on an oscilloscope screen, it will often be the case for various practical applications that only a very small part of the totality of the thusly displayed information, or some simple aspect of it, is actually needed; this is often the case, for example, in routine factory testing and operating measurements with telephone cables. Very often, the only thing actually of interest and to be ascertained from the entire measuring procedure is merely the maximum or minimum value of the attenuation or amplification of the two-port, and an indication of the frequency or frequency range at which such maximum or minimum value occurs.

SUMMARY OF THE INVENTION

It is a general object of the present invention to provide a measuring technique and apparatus which affords a quickly produced and easily read-off digital indication of the maximum or minimum value of the attenuation or amplification of a two-port and an approximate indication of the frequency, or frequency range, at which such maximum or minimum value occurs, with both the method and apparatus employed being as simple as possible.

A related object is to provide a measuring technique and apparatus easily employed by semiskilled personnel.

A further related object is to provide such a measuring technique and apparatus requiring only a battery for its power source and consuming low current.

Also, the technique and apparatus employed should be compatible for use with standard commercial auxiliary units when more precise measurements or data are required and/or when a record of the measured data is needed.

In accordance with the present invention, the frequency of the A.C. voltage applied to the input terminal-pair of the two-port is, as customary, furnished by an A.C. voltage generator whose frequency is electronically varied by means of a controllling sawtooth voltage. However, additionally, the frequency-determining sawtooth voltage is applied to the inputs of at least three comparators, or equivalent means, the at least three comparators serving to define at least four successive frequency ranges. At least four frequency-range indicators elements, such as small lamps, light-emitting diodes, or the like, are provided, each associated with a respective one of such at least four frequency ranges, and these frequency-range indicator elements are connected to the outputs of the at least three comparators through the intermediary of a logic and storage circuit stage. The logic and storage circuit is operative, first, for correlating the output signals of the at least three comparators with the inputs of the at least four frequency-range indicator elements. In addition, the logic and storage circuit receives a maximum-value signal from a digital measuring device, the latter being connected to measure the A.C. voltage across the output terminal-pair of the two-port. In this way, that one of the at least four frequency-range indicator elements is activated in correspondence to which of the at least four frequency ranges contains the extreme value of interest.

The present invention accordingly provides a frequency-response measuring device which is extremely readily and directly implemented using presentday circuit modules, and which is both very inexpensive and also easily provided as a handy little device conveniently employed in difficult circumstances such as at installation sites during construction and installation work and well suited to the capabilities of semiskilled personnel; also, it is readily battery-powered and therefore independent of the sometimes problematic situations arising when a connection to a mains supply voltage must be found.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
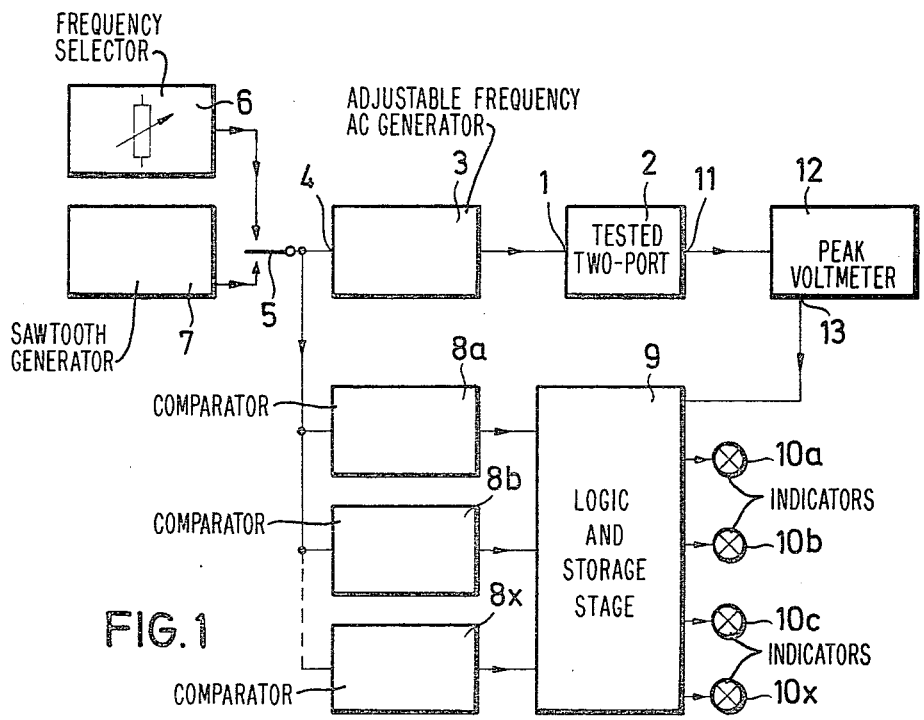
FIG. 1 schematically depicts a first exemplary apparatus used for performing a first exemplary version of the inventive method.

FIG. 1 depicts schematically a first exemplary circuit arrangement which can be employed for performing the inventive frequency-response measuring procedure.

Numeral 1 denotes the input (i.e., input terminal-pair) of a two-port (i.e., two-terminal-pair device) 2 whose frequency response is to be tested within a certain frequency range. An A.C. voltage is applied to the input 1 of two-port 2 by an adjustable-frequency A.C. voltage generator 3. The output voltage of A.C. voltage generator 3 is constant, but its frequency can be continuously varied within the frequency range to be explored. The frequency of A.C. voltage generator 3 is linearly dependent upon the magnitude of a control voltage applied to its control input 4. Control input 4 is connectable, via a manually operated changeover switch 5, to either the output of a manually adjusted frequency selector 6 or else to the output of a sawtooth-voltage generator 7. The minimum and maximum magnitudes of the sawtooth ramps produced by sawtooth-voltage generator 7 determine the extremes of the frequency range to be explored.

The voltage applied to frequency-control input 4, whether from manual frequency selector 6 or from sawtooth generator 7, is applied in common to the inputs of at least three comparators 8a, 8b, ..., 8x, these at least three comparators having reference-voltage levels such as to define at least four successive frequency ranges, with which are associated at least four frequency-range indicator elements 10a, 10b, 10c, ..., 10x, here shown as small indicator lamps, but equally well light-emitting diodes, or the like. The inputs of the at least four frequency-range indicator elements 10a, 10b, 10c, ..., 10x are connected to the outputs of the at least three comparators 8a, 8b, ..., 8x through the intermediary of a logic and storage stage 9.

Logic and storage stage 9 serves, first, to correlate the inputs of the four indicator elements 10a, 10b, 10c, 10x with the outputs of the three comparators 8a, 8b, 8x, i.e., so that each of the four frequency ranges established by the three comparators be associated with a single indicator element. This of course can be implemented using elementary logic gates. For example, if the threshold level of even the first comparator 8a fails to be exceeded (its output signal is a "0"), then this identifies the first frequency range involved and is coordinated with indicator element 10a, e.g., by means of an inverter connected between the output of comparator 8a and the input of indicator element 10b. Likewise, for the second of the four frequency ranges, the threshold level of first comparator 8a is exceeded (its output signal is a "1"), but that of second comparator 8b is not exceeded (its output signal is a "0"), and this can of course be recognized using, for example, an AND-gate having a first input connected to the output of first comparator 8a and having a second input which is connected to the output of second comparator 8b via an inverter, with such AND-gate having an output line connected to the input of the second frequency-range indicator element 10b. And so forth.

Thus, by way of example, an interconnected logic-gate network having three input lines connected to the outputs of the three comparators 8a, 8b, 8x and four output lines connected to the inputs of the four indicator elements 10a, 10b, 10c, 10x, would be sufficient to establish the correlation in question.

Secondly, logic and storage stage 9 performs a storage function; i.e., when a signal causing one of the frequency-range indicator elements 10a, 10b, 10c, 10x to light up is received, such signal should be stored, so that the affected indicator element be persistently illuminated, until the entire device is reset for another measurement. It will be clear that such a storage function can be implemented, for example, using four flip-flops, each connected in a respective one of the four output lines just referred to. Preferably, such four flip-flops would be interconnected, in conventional manner, such that only one at a time can occupy its set state, i.e., so that setting of a presently unset flip-flop would automatically reset the presently set flip-flop.

Thirdly, logic and control stage 9, besides correlating the four indicator elements with the three comparators, and besides performing the storage or holding function just mentioned, also participates in the selection of which one of the four indicator elements 10a, 10b, 10c, 10x is in fact to be persistently illuminated. This is done by stage 9 in cooperation with a digital voltage measuring unit 12 exhibiting maximum-value storage action, a logarithmic transfer function, and having an output line 13 on which a signal is produced whenever the value of the input signal being received by maximum-value-storing digital voltmeter 12 is in excess of the highest value thus far registered by voltmeter 12, e.g., whenever the storage capacitor in peak-storage voltmeter 12 is undergoing actual charging, if a storage capacitor is employed.

Thus when the frequency of an A.C. voltage generator is progressively varied from one extreme to the other, i.e., passing through all four frequency ranges defined by the three comparators 8a, 8b, 8x, output signals appear on successive ones of the four logic-gate-network output lines referred to above, for the storage units (e.g., flip-flops) connected to the inputs of each of the four successive indicator elements 10a, 10b, 10c, 10x, in turn. By way of example, four AND-gates, each connected in a respective one of such four output lines, can each have an output connected to the input of a respective one of the four storage units, a first input connected to a respective one of the four outputs of the logic-gate network, with all four such AND-gates having second inputs connected in common to output line 13 from peak-value-storing digital voltmeter 12. During the complete frequency runthrough, as the maximum output voltage-value from two-port output terminal-pair 11 is searched out, output signals will appear at the outputs of those of the four AND-gates in whose corresponding frequency range maximum-value increases are encountered, and upon completion of the entire frequency runthrough only a single one of the four storage units (e.g., flip-flops) will be in set state, and only a single one of the four frequency-range indicator elements 10a, 10b, 10c, 10x will be in illuminated state. Thereafter, even if the frequency runthrough is repeated, the illumination states of the four indicator elements 10a, 10b, 10c, 10x will persist unaffected by such further frequency runthroughs, e.g., until such time as the operator presses a reset button to reset the peak-value-storing digital voltmeter 12.

Accordingly, at the end of the complete frequency runthrough, the one of the four frequency-range indicator elements which is in illuminated state will indicate which of the four frequency-ranges in question exhibits the point of lowest attenuation in the frequency-response curve of the two-port 2, or the point of greatest amplification if two-port 2 is in active device.

It will be clear that the number of frequency ranges can be increased from the four here referred to by way of example, by employing a correspondingly greater number of comparators 8, a correspondingly greater number of indicator elements 10, and a logic and storage stage 9 having a correspondingly greater number of input and output lines and internal logic gates and storage units. I.e., the total range of frequencies through which the device sweeps can be subdivided as finely, into as many component ranges, as desired.

Figure 2:
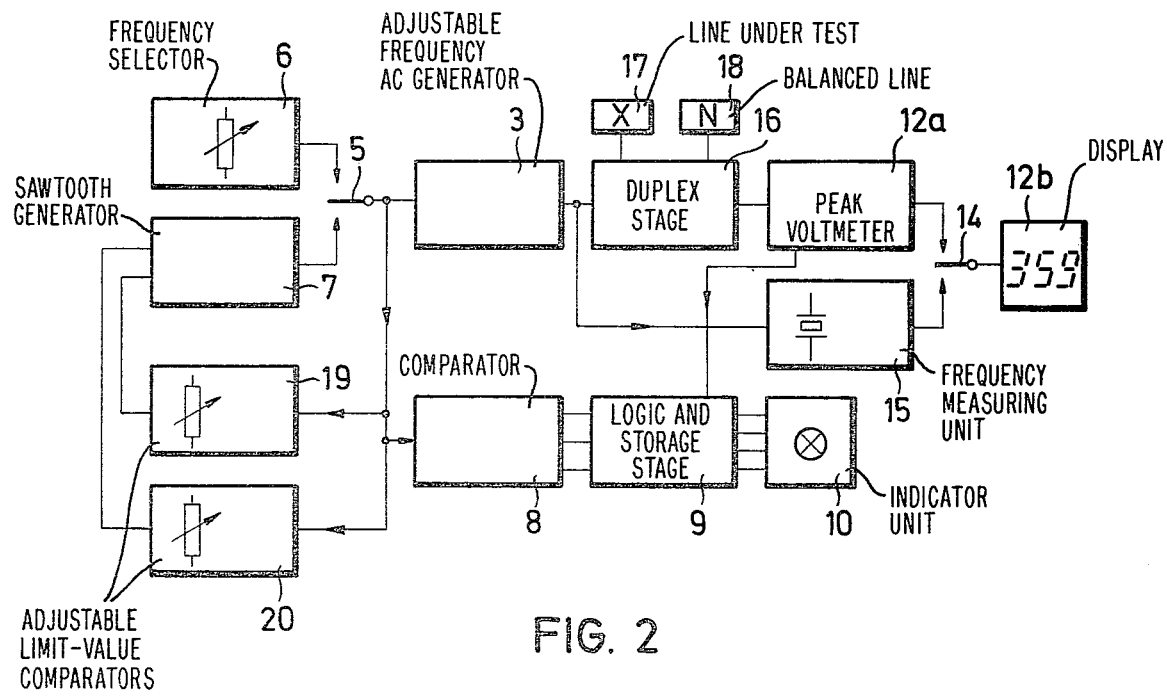
FIG. 2 depicts an embodiment having expanded capabilities relative to those of FIG. 1.

FIG. 2 is a schematic block diagram of a second such circuit arrangement, exhibiting somewhat expanded capabilities. Components corresponding to those of FIG. 1 are denoted here by the same reference numerals as there. The peak-value-storing digital voltmeter 12 of FIG. 1 is here shown split into a first stage 12a, which is the same as stage 12 in FIG. 1 but with the omission of the digital display stage thereof, plus the digital display stage 12b thereof per se. A changeover switch 14 connects the input of digital display stage 12b either to the output of measuring stage 12a, to yield exactly the same action as described with respect to FIG. 1, or alternatively connects display stage 12b to the output of an auxiliary frequency-measurement stage 15. The input of auxiliary frequency-measurement stage 15 is connected to the output of the variable-frequency A.C. voltage generator 3.

For the sake of simplicity, the series of comparators 8a, 8b, . . . , 8x of FIG. 1 are here shown consolidated into a single block 8 having three output lines, and likewise the indicator elements 10a, 10b, 10c, . . . , 10x are shown consolidated into a single block 10, but they operate in the same manner as in FIG. 1.

Connected intermediate the output of A.C. voltage generator 3 and the input of voltmeter stage 12, is a fork or duplex stage 16 having connections for a line 17 which is to be tested with respect to reflections and for an artificial balancing line 18. In this way it is, in other respects in conventional manner, possible to measure reflection-attenuation effects on any desired communications line.

The frequency-determining sawtooth voltage from the output of sawtooth generator 7 is, in this embodiment, additionally applied to the inputs of two limit-value comparators 19, 20, whose outputs are connected to control inputs of the sawtooth generator 7. The two limit-value comparators 19, 20 are manually adjustable and serve to select the magnitude which the sawtooth ramp employed is to have at its start and at its end, to thereby manually select the initial and final frequencies for the frequency runthrough to be performed. When the operator wishes to select the lower upper limit frequencies of the frequency runthrough to be employed, i.e., by individually adjusting the threshold levels of the two comparators 19, 20, he advantageously flips switch 14 to engage the output of the auxiliary frequency-measuring unit 15, resulting in digital display of the frequencies involved, to assist him in performing a high-precision manual selection of limit frequencies.

Advantageously, the output of sawtooth generator 7, the output of A.C. voltage generator 3, the input of voltmeter stage 12a, and the input of auxiliary frequency-measuring unit 15 are connectable by means of (non-illustrated) manual switches to various (non-illustrated) externally available terminals of the device, in order to be able to utilize various ones of such components for purposes in addition to those for which they are shown interconnected in FIG. 2. Thus, for example, switch 14 can be switched over to engage the output of frequency-measuring stage 15, with a (non-illustrated) switch at the input of stage 15 being manually swtiched over to disconnect the input of stage 15 from the output of A.C. voltage generator 13 and instead connect the input of stage 15 to an externally accessible terminal, to which can then be applied a signal whose frequency is to be measured; i.e., components 15 and 12b of the illustrated arrangement, by means of such additional switches leading to externally accessible terminals, could then be used as a simple frequency meter. Similar remarks apply to the voltmeter stage 12a which could, in that way, be used to measure the level of a voltage signal other than that supplied from voltage generator 3. Likewise, by switching over a (non-illustrated) switch to connect the output of voltage generator 3 to (non-illustrated) externally accessible terminal of the device, the device can then be used as a varied-frequency signal source or wobbulator. Additionally, it will be understood that commercially available peak-value-storing voltmeters, such as 12 in FIGS. 1 and 2, are typically provided with the capability to override the peak-value-detection action and indicate instantaneous voltage directly, and preferably the voltmeter stage 12a is of that type, so that its output can be disconnected from digital display stage 12b and instead connected to the y-deflection input of an oscilloscope or oscillograph, with the output signal from sawtooth generator 7 connected to the x-deflection input thereof. And so forth.

It will be understood that each of the elements described above, or two or more together, may also find a useful application in other types of circuits and constructions differing from the types described above.

While the invention has been illustrated and described as embodied in two exemplary devices used to perform two exemplary versions of the inventive method, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A device for quickly performing simple frequency-response measurements on two-ports, the device comprising, in combination, a controllable-frequency constant-output-voltage A.C. voltage generator having an output for connection to the input of a two-port, and furthermore having a frequency-control input; a sawtooth generator furnishing a sawtooth signal to the frequency-control input to cause the frequency of the A.C. voltage generator to be continuously varied; a peak-value-storing digital meter having an input for connection to the output of such two-port and also having a control-signal output for furnishing a control signal dependent upon the detection of a peak value by the meter; a set of at least three comparators having inputs connected to receive the sawtooth signal and having respective reference levels such as to define at least four successive frequency ranges; a set of indicator elements, one for each of the at least four successive frequency ranges; and logic and storage circuit means having a set of inputs connected to the output of the comparators, a set of outputs connected to the indicator elements and a control input connected to receive said control signal, and operative for causing different ones of the indicator elements in said set of indicator elements to become activated depending upon which one of said frequency ranges contains the peak value registered by the peak-value-storing meter.

2. The device defined in claim 1, wherein said digital meter comprises a first stage operative for ascertaining the peak value of a metered signal and a second stage comprising a digital display, furthermore including a frequency-measuring stage and changeover switch means operative for alternatively connecting the digital display to the output of said first stage or to the output of the frequency-measuring stage.

3. The device defined in claim 1, furthermore including intermediate the output of the A.C. voltage generator and the input of the digital meter a fork or duplex circuit provided with terminals for connecting-on a line which is to be tested with respect to reflection-attenuation effects and also an artificial balancing line.

4. The device defined in claim 2, furthermore including means for manually selecting the initial and terminal magnitudes of the sawtooth signal furnished by the sawtooth generator whereby to manually select the lower and upper frequencies from the one of which to the other of which the frequency of the A.C. voltage generator is varied, and furthermore including means connecting the input of said frequency-measuring stage to the output of the A.C. voltage generator to afford the user a digital display of frequency on said digital display when he is manually selecting such lower and upper frequencies.

5. A method for quickly performing simple frequency-response measurements on two-ports, comprising, in combination, the steps of applying a constant-amplitude voltage which is continuously varied in frequency to the input of the two-port of interest, by connecting to the input of the two-port a constant-output-voltage A.C. voltage generator having a frequency-control input and using a sawtooth generator to apply a sawtooth signal to the frequency-control input; using a peak-value-storing digital meter connected to the output of the two-port for registering the peak value of the signal produced at the output of the two-port during the continuous variation in frequency and also for generating a control signal dependent upon the detection of a peak value by such meter; applying the sawtooth signal additionally to the inputs of at least three comparators having respective reference levels such as to define at least four successive frequency ranges; and using a set of indicator elements, one for each of the at least four successive frequency ranges, to indicate which one of the four frequency ranges contains the peak value registered by the peak-value registered by the peak-value-storing meter, this being performed using a logic and storage circuit having inputs connected to the outputs of the comparators and outputs connected to the indicator elements and furthermore having a control input connected to receive said control signal.

* * * * *